(12) United States Patent
Rubehn

(10) Patent No.: US 10,080,288 B2
(45) Date of Patent: Sep. 18, 2018

(54) CIRCUIT PACKAGE

(71) Applicant: Micronas GmbH, Freiburg (DE)

(72) Inventor: Thilo Rubehn, Gundelfingen (DE)

(73) Assignee: TDK-Micronas GmbH, Freiburg (DE)

( * ) Notice: Subject to any disclaimer, the term of this patent is extended or adjusted under 35 U.S.C. 154(b) by 225 days.

(21) Appl. No.: 14/939,409

(22) Filed: Nov. 12, 2015

(65) Prior Publication Data

US 2016/0135298 A1    May 12, 2016

(30) Foreign Application Priority Data

Nov. 11, 2014   (DE) .................. 10 2014 016 565

(51) Int. Cl.
*H05K 1/18*    (2006.01)
*G01R 33/00*   (2006.01)

(52) U.S. Cl.
CPC ........... *H05K 1/18* (2013.01); *G01R 33/0047* (2013.01); *H01L 2224/05554* (2013.01); *H01L 2224/4813* (2013.01); *H01L 2224/48091* (2013.01); *H01L 2224/49113* (2013.01)

(58) Field of Classification Search
CPC .................. H05K 1/18; G01R 33/0047; H01L 2224/49113; H01L 2224/48091; H01L 2224/4813
USPC .......................................................... 361/783
See application file for complete search history.

(56) References Cited

U.S. PATENT DOCUMENTS

| | | | |
|---|---|---|---|
| 4,808,918 A * | 2/1989 | Rozman ................. | G01R 21/08 324/117 H |
| 4,972,141 A * | 11/1990 | Rozman ................. | G01R 21/08 324/117 H |
| 5,918,112 A | 6/1999 | Shah et al. | |
| 8,805,638 B2 | 8/2014 | Morath | |
| 2008/0276474 A1 | 11/2008 | Hayama | |
| 2010/0007013 A1* | 1/2010 | Kuroda ................. | H01L 23/367 257/712 |
| 2011/0001587 A1 | 1/2011 | Sutardja | |

(Continued)

FOREIGN PATENT DOCUMENTS

CN    101944526        1/2011
CN    102208376 A     10/2011

(Continued)

*Primary Examiner* — Michael P McFadden
(74) *Attorney, Agent, or Firm* — Muncy, Geissler, Olds & Lowe, P.C.

(57) ABSTRACT

A circuit package having a first semiconductor body with a first monolithic integrated circuit having a first signal output that is interconnected with a bonding surface, and a first signal input that is interconnected with a bonding surface. The circuit package also has a second semiconductor body with a second monolithic integrated circuit having a second signal output that is interconnected with a bonding surface, and a second signal input that is interconnected with a bonding surface. The circuit package further features a contact element with at least one bonding surface, and a carrier element, wherein the bonding surface of the first signal output and the bonding surface of the second signal input are interconnected with the contact element so that an electrical connection exists between the first signal output and the second signal input, and a portion of the contact element penetrates the circuit package.

12 Claims, 1 Drawing Sheet

(56) References Cited

U.S. PATENT DOCUMENTS

2012/0081109 A1* 4/2012 Astegher ................ G01R 33/07
324/251
2016/0043537 A1* 2/2016 Wortberg ................. H02H 3/08
361/101

FOREIGN PATENT DOCUMENTS

| DE | 198 30 475 A1 | 1/1999 |
| DE | 20 2009 017 430 U1 | 6/2011 |
| DE | 10 2011 075 679 A1 | 11/2012 |

* cited by examiner

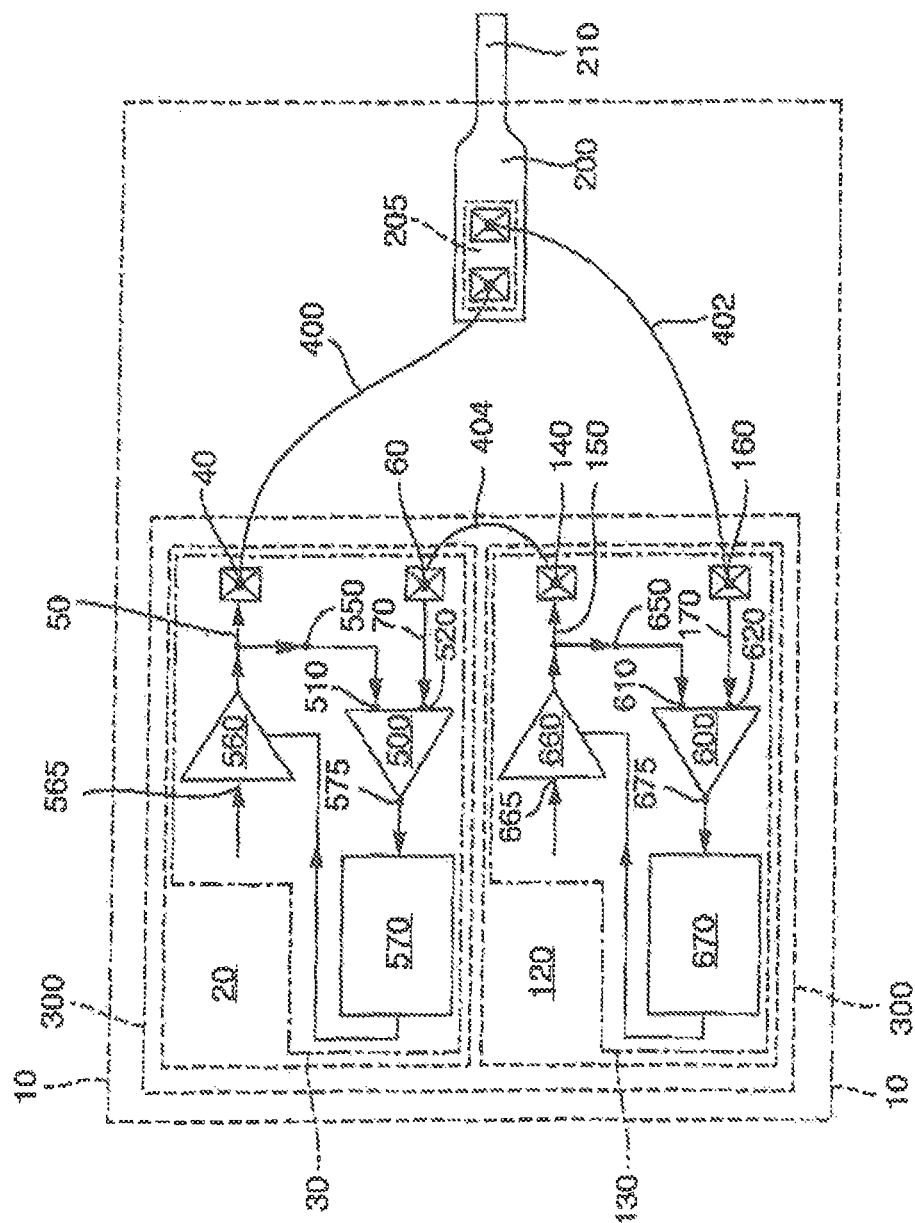

CIRCUIT PACKAGE

This nonprovisional application claims priority under 35 U.S.C. § 119(a) to German Patent Application No. 10 2014 016 565.5, filed Nov. 11, 2014, which is herein incorporated by reference.

BACKGROUND OF THE INVENTION

Field of the Invention

The invention relates to a circuit package.

Description of the Background Art

From DE 20 2009 017 430 U1, which corresponds to U.S. Pat. No. 8,805,638, a sensor casing with two sensors and a first integrated circuit and a second integrated circuit is known. Furthermore, from DE 10 2011 075 679 A1, an arrangement with two sensors is known.

SUMMARY OF THE INVENTION

It is therefore an object of the invention to provide a device that furthers the current state of technology.

According to an exemplary embodiment, a circuit package is provided featuring a first semiconductor body with a first, monolithic integrated circuit, wherein the first circuit comprises a first signal output that is interconnected with a bonding surface, and a first signal input that is interconnected with a bonding surface. The circuit package further features a second semiconductor body with a second monolithic integrated circuit, wherein the second circuit comprises a second signal output that is interconnected with a bonding surface, and a second signal input that is interconnected with a bonding surface. The circuit package also features a contact element with at least one bonding surface and further includes a carrier element, wherein the bonding surface of the first signal output and the bonding surface of the second signal input are interconnected with the contact element so that an electrical connection exists between the first signal output and the second signal input, and a portion of the contact element penetrates the circuit package. The contact element can also be referred to as a pin. The bonding surface of the contact element receives at least the two bonds at the first signal output or at the second signal input. The carrier can also be referred to as leadframe, and both semiconductor bodies, also known as dies, can be connected in a force-fitting manner with the carrier. The components referenced, i.e. the two semiconductor bodies and a large part of the contact element and the carrier, can be arranged inside the circuit package. The process of forming the circuit package can also be referred to as molding, the circuit package also as IC-packaging.

One advantage of the arrangement is that within a single circuit package, two dies are arranged, yet externally, only the signal output of the first semiconductor body can be connected. Since the first signal output is also interconnected with the second signal input, the functionality of the first integrated circuit can be monitored. The second signal input does not feature any electrical connection outside of the circuit package, or, in other words, the second signal input can be exclusively interconnected inside the circuit package with the first signal output via the contact element.

The bonding surface of the second signal output can be interconnected with the bonding surface of the first signal input. In an embodiment, the bonding surfaces can be interconnected by way of bonding wires, for example, so-called bonds.

In an embodiment, the first semiconductor body and the second semiconductor body can be arranged on the shared carrier either stacked on top of, or next to each other.

In an embodiment, the first semiconductor body and the second semiconductor body both can feature a sensor. The sensors can be substantially or identical, i.e. measure the same physical quantity with, preferably, the same sensitivity. Both sensors can be formed as magnetic field sensors, particularly as hall elements, most preferably as hall plates.

In an embodiment, the two semiconductor bodies, i.e. the first semiconductor body and the second semiconductor body, feature the same circuit elements and are redundant to one another.

In an embodiment, analog signals rest closely against both the first signal output and the second signal output. Both circuits can each include one comparator with a first input and a second input, with the respective signal output of the respective circuit interconnected with the first input of the corresponding comparator, and the respective signal input of the two circuits with the corresponding second inputs of the respective comparators by way of a corresponding conductor track section.

In this way, the functionality of the first circuit and/or the first sensor and the second circuit and/or the second sensor can be advantageously monitored via the redundant arrangement, wherein the second signal output does not lead out of the circuit package.

In other words, the comparator of the first circuit compares the output signal of the second circuit with the output signal of the first circuit. The same process is followed with the second circuit in that the comparator of the second circuit compares the output signal of the second circuit with the output signal of the first circuit. From a technical point of view, a difference is that only the output signal of the first circuit leads outwards, i.e. only one single pin is associated with the total of four signal-conducting leads. An advantageous, redundant arrangement has thereby been created, which monitors itself.

BRIEF DESCRIPTION OF THE DRAWING

The present invention will become more fully understood from the detailed description given hereinbelow and the accompanying drawing which are given by way of illustration only, and thus, are not limitive of the present invention, and wherein the sole image illustrates a top view of an exemplary circuit package.

DETAILED DESCRIPTION

The illustration shows a circuit package 10 that features a first semiconductor body 20 with a first monolithic integrated circuit 30, wherein the first circuit 30 comprises a first signal output 50 interconnected with a bonding surface 40, and a first signal input 70 interconnected with a bonding surface 60.

Furthermore, the circuit package 10 includes a second semiconductor body 120 with a second monolithic integrated circuit 130, wherein the second circuit 130 comprises a second signal output 150 interconnected with a bonding surface 140, and a second signal input 170 interconnected with a bonding surface 160. Both semiconductor bodies 20 and 120 feature the same semiconductor devices and are redundant to one another.

The circuit package 10 comprises a contact element 200 with at least one bonding surface 205 and comprises a carrier element 300, wherein the bonding surface 40 of the first signal output 50 is interconnected via a bonding wire 400, and the bonding surface 160 of the second signal input 170 is interconnected via a bonding wire 402 with the contact element 200 via the bonding surface 205, so that an electrical connection exists between the first signal output 50 and the second signal input 170. A portion 210 of the contact element 200 penetrates the circuit package 10.

The first semiconductor body 20 and the second semiconductor body 120 are arranged adjacent to each other on a shared carrier 300. The first semiconductor body 20 and the second semiconductor body 120 each feature a hall sensor which is not shown.

The bonding surface 140 of the second signal output 150 is interconnected with the bonding surface 60 of the first signal input 70 via a bonding wire 404. In other words, the second signal output 150 and the first signal input 70 are interconnected exclusively outside of the circuit package 10.

The first circuit 30 comprises a comparator 500 with a first input 510 and a second input 520. The first signal output 50 is interconnected with the first input 510 of the comparator 500. Furthermore, the first signal input 70 is interconnected with the second input 520 of the comparator 500 via a conductor track section 550.

The first signal output 50 is controlled by an operational amplifier 560 formed in the first circuit 30 so that an analog signal rests at the first signal output 50. Preferably the signal of the hall sensor that is integrated with the first circuit 30 rests at an input 565 of the operational amplifier 560.

The comparator 500 of the first circuit 30 features an output 580 interconnected with a control unit 570. The control unit 570 of the first circuit 30 is interconnected with the operational amplifier 560. In this way, the control unit 570 can regulate the amplification of the operational amplifier 560, subject to the result of the comparison of the comparator 500.

The second circuit 130 comprises a comparator 600 with a first input 610 and a second input 620. The second signal output 150 is interconnected with the first input 610 of the comparator 600. Furthermore, the second signal input 170 is interconnected with the second input 620 of the comparator 600 via a conductor track section 650.

The second signal output 150 is controlled by an operational amplifier 660 formed in the second circuit 130, so that an analog signal rests at the second signal output 150. Preferably, the signal of the hall sensor that is integrated with the second circuit 130 rests at an input 665 of the operational amplifier 660.

The comparator 600 of the second circuit 130 features an output 675 interconnected with a control unit 670. The control unit 670 of the second circuit 130 is interconnected with the operational amplifier 660. In this way, the control unit 670 can regulate the amplification of the operational amplifier 660, subject to the result of the comparison of the comparator 600.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit package comprising:
   a first semiconductor body with a first monolithic integrated circuit, the first monolithic circuit comprises a first signal output that is interconnected with a first bonding surface, and a first signal input that is interconnected with a second bonding surface;
   a second semiconductor body with a second monolithic integrated circuit, the second monolithic integrated circuit comprises a second signal output that is interconnected with a third bonding surface, and a second signal input that is interconnected with a fourth bonding surface;
   a circuit housing enclosing the first semiconductor body, the second semiconductor body, the first signal input, the first signal output, the second signal input, and the second signal output, and enclosing the first, second, third, and fourth bonding surfaces;
   a single contact element with at least one bonding surface; and
   a carrier element,
   wherein the first semiconductor body and the second semiconductor body are both disposed on the carrier element,
   wherein the second monolithic integrated circuit is substantially similar to the first monolithic integrated circuit, such that the second monolithic integrated circuit measures a same physical quantity as the first monolithic integrated circuit, so that the first monolithic integrated circuit monitors and compares its signal measurements with the second monolithic integrated circuit,
   wherein the first bonding surface of the first signal output and the fourth bonding surface of the second signal input are interconnected with the contact element so that an electrical connection exists between the first signal output and the second signal input, and
   wherein a portion of the contact element extends from within the circuit housing to an exterior of the circuit housing.

2. The circuit package according to claim 1, wherein the first semiconductor body and the second semiconductor body are arranged on the carrier element, and either stacked on top of, or next to each other.

3. The circuit package according to claim 1, wherein the first semiconductor body and the second semiconductor body each comprise a sensor.

4. The circuit package according to claim 1, wherein the first semiconductor body and the second semiconductor body are redundant to one another in that both semiconductor bodies comprise substantially identical circuit elements.

5. The circuit package according to claim 1, wherein the third bonding surface of the second signal output is interconnected with the second bonding surface of the first signal input.

6. The circuit package according to claim 1, wherein the second signal output and the first signal input comprise a connection inside the circuit housing.

7. The circuit package according to claim 1, wherein first, second, third, and fourth bonding surfaces are interconnected by bonding wires.

8. The circuit package according to claim 1, wherein the first and second semiconductor bodies each include a hall sensor.

9. The circuit package according to claim 1, wherein analog signals are provided at the first signal output and at the second signal input.

10. The circuit package according to claim 1, wherein each of the first and second monolithic integrated circuits comprise a comparator with a first input and a second input, and a respective signal output of the respective circuit is interconnected with the first input of the corresponding comparator, and the respective signal input of the first and second monolithic integrated with the respective second inputs of the respective comparators by a conductor track section.

11. The circuit package according to claim 1, wherein a first comparator on the first monolithic integrated circuit receives a measurement output from the second monolithic integrated circuit for verification by parallel measurement in the first monolithic integrated circuit.

12. The circuit package according to claim 1, wherein the first semiconductor body and the second semiconductor body are disposed directly on the carrier, the carrier being a common, uniform substrate.

\* \* \* \* \*